US 11,955,978 B1

(12) United States Patent
Alon et al.

(10) Patent No.: US 11,955,978 B1
(45) Date of Patent: Apr. 9, 2024

(54) CIRCUIT FOR A VOLTAGE COMPARATOR

(71) Applicant: Blue Cheetah Analog Design, Inc., Sunnyvale, CA (US)

(72) Inventors: Elad Alon, Lafayette, CA (US); Eric Naviasky, Ellicott City, MD (US)

(73) Assignee: Blue Cheetah Analog Design, Inc., Sunnyvale, CA (US)

( * ) Notice: Subject to any disclaimer, the term of this patent is extended or adjusted under 35 U.S.C. 154(b) by 0 days.

(21) Appl. No.: 18/105,504

(22) Filed: Feb. 3, 2023

(51) Int. Cl.
*H03K 5/24* (2006.01)
*G06G 7/184* (2006.01)
*H03K 17/687* (2006.01)

(52) U.S. Cl.
CPC .......... *H03K 5/2472* (2013.01); *G06G 7/184* (2013.01); *H03K 17/6872* (2013.01)

(58) Field of Classification Search
CPC .......... H03K 3/02; H03K 3/023; H03K 3/027; H03K 3/353; H03K 5/22; H03K 5/24; H03K 5/2472; H03K 5/2481; H03K 5/249; H03K 17/687; H03K 17/6872; H03F 1/38; H03F 2200/51; G06G 7/184
See application file for complete search history.

(56) References Cited

U.S. PATENT DOCUMENTS 11,601,117 B1 * 3/2023 Lin .......... G11C 7/065
2023/0057357 A1 * 2/2023 Lin .......... H03K 3/037

* cited by examiner

*Primary Examiner* — Long Nguyen
(74) *Attorney, Agent, or Firm* — Chuang Intellectual Property Law; Thomas Chuang

(57) ABSTRACT

Methods and apparatuses for voltage comparators are described. In one example, a circuit for a voltage comparator includes a first transistor, a second transistor for receiving a first input voltage at a second transistor gate terminal, and a third transistor for receiving a second input voltage at a third transistor gate terminal. The second transistor and the third transistor are connected to the first transistor at a first node. A fourth transistor is connected to the second transistor at a second node, and a fifth transistor is connected to the third transistor at a third node. One or more capacitors are connected between the third node and a fourth node, where the fourth node includes the second transistor gate terminal. One or more capacitors are connected between the second node and a fifth node, where the fifth node includes the third transistor gate terminal. In one example operation, the one or more capacitors provide regenerative gain.

24 Claims, 7 Drawing Sheets

CIRCUIT FOR A VOLTAGE COMPARATOR

BACKGROUND OF THE INVENTION

Voltage comparators are used in a variety of applications, including data communications. A voltage comparator outputs an indication of which of two input voltages is larger or smaller. Dynamic voltage comparators utilize a clock or triggered signal to compare inputs at distinct points in time. In the prior art, dynamic comparators generally fall into two topologies: dual tail comparators (also referred to "double tail" or "race to bottom" comparators) and strong arm comparators.

FIG. 1 illustrates a schematic block diagram of a dual tail comparator 1. The dual tail comparator 1 includes a preamplifier stage 2 (also referred to as an input stage) and a latch stage 4. The preamplifier stage 2 receives the input voltages In1 (10) and In2 (12) for comparison, and operates as a preamplifier having a signal gain. The preamplifier stage 2 and the latch stage 4 are connected at a node n (6) and a node o (8). The latch stage 4 outputs the output voltages Out1 (14) and Out2 (16) as a result of the comparison between the input voltages In1 (10) and In2 (12).

FIG. 2 illustrates a preamplifier stage 2 in the prior art. The preamplifier stage 2 includes an NMOS transistor M1 (20), an NMOS transistor M2 (22), an NMOS transistor M3 (24), a PMOS transistor M4 (26), and a PMOS transistor M5 (28). The gate of the NMOS transistor M2 (22) receives the input voltage In1 (10) and the gate of the NMOS transistor M3 (24) receives the input voltage In2 (12). Operation of the preamplifier stage 2 is controlled by a clock signal Clk (34) which is received at the gates of the NMOS transistor M1 (20), the PMOS transistor M4 (26), and the PMOS transistor M5 (28). The source terminal of the PMOS transistor M4 (26) and the PMOS transistor M5 (28) are connected to a supply voltage Vdd 30, and the drain terminal of the NMOS transistor M1 (20) is connected to a ground 32. The ramp down speed at the node n (6) and the node o (8) is dependent on the magnitudes of In1 (10) and In2 (12).

The inventors have recognized a variety of limitations in conventional voltage comparators. Voltage comparators have a difficult set of requirements and desired characteristics. It is desired the voltage comparator (1) be able to compare over a wide range of input voltages, preferably the entire range of the supply rails, (2) have low offset voltage and, often even more importantly, low drift of offset voltage, and (3) have low power dissipation and power dissipation that scales with the clock rate for dynamic comparators.

Disadvantageously, for example, the preamplifier stage 2 in the prior art shown in FIG. 2 has limited gain, so the contribution of the offset and offset drift in the latch stage 4 are significant. The strong arm topology suffers from having a large number of transistors involved in the sense and regeneration paths, increasing both the random component of the offset and the offset drift with temperature and voltage. Both dual tail comparators and strong arm comparators lose speed as the common mode limit is approached and stop working within several hundred millivolts of the problematic rail.

As a result, improved apparatuses and methods for voltage comparators are needed.

BRIEF DESCRIPTION OF THE DRAWINGS

The present invention will be readily understood by the following detailed description in conjunction with the accompanying drawings, wherein like reference numerals designate like structural elements.

DESCRIPTION OF SPECIFIC EMBODIMENTS

Figure 1:
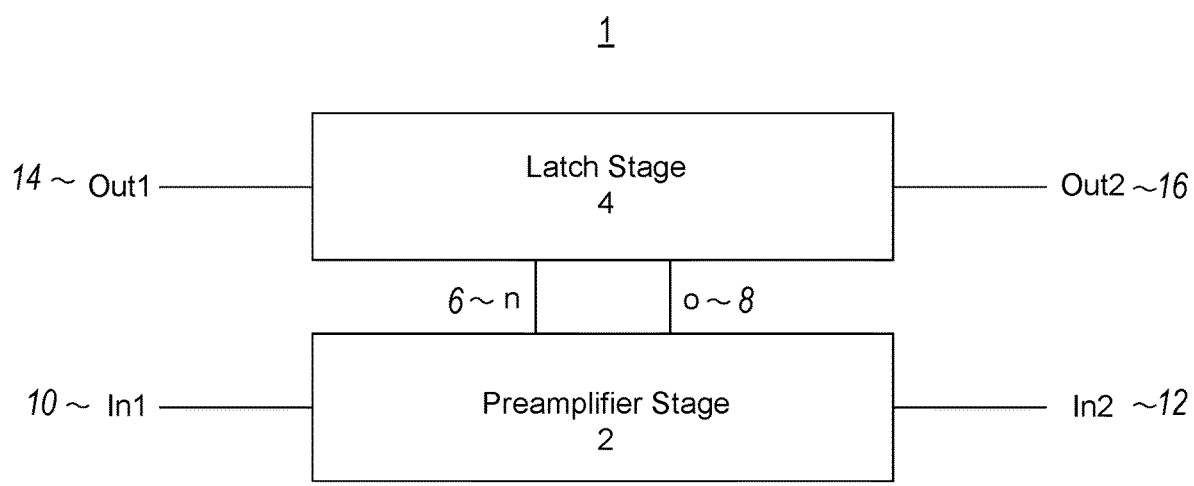
FIG. 1 illustrates a schematic block diagram of a dual tail comparator.
Figure 2:
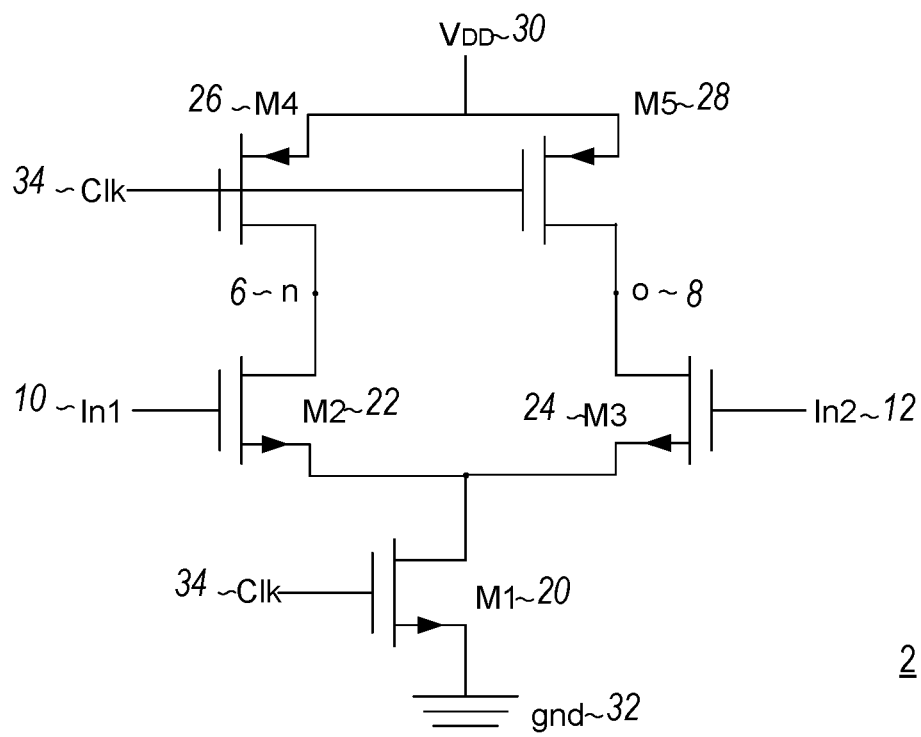
FIG. 2 illustrates a preamplifier stage of a dual tail comparator in the prior art.

Methods and apparatuses for voltage comparators are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein.

In one example embodiment of the invention, a circuit for voltage comparator limits the number of active components contributing offset and offset drift to a minimum, and employs regenerative gain (i.e., positive feedback gain) to increase gain without the use of additional active components. The circuit is operable to adjust the common mode voltage at the input transistors, enhancing operation of the voltage comparator over a wide input common mode range. In one example, the circuit is a preamplifier stage of a dual tail voltage comparator.

In one example embodiment of the invention, a circuit for a voltage comparator includes a first transistor, a second transistor for receiving a first input voltage at a second transistor gate terminal, and a third transistor for receiving a second input voltage at a third transistor gate terminal. The second transistor and the third transistor are connected to the first transistor at a first node. The circuit further includes a fourth transistor and a fifth transistor. The fourth transistor is connected to the second transistor at a second node, and the fifth transistor is connected to the third transistor at a third node. One or more capacitors are connected between the third node and a fourth node, where the fourth node includes the second transistor gate terminal. One or more capacitors are connected between the second node and a fifth node, where the fifth node includes the third transistor gate terminal. In one example, the circuit is a preamplifier stage of a dual tail voltage comparator.

In one example embodiment of the invention, a circuit for a voltage comparator includes a first NMOS transistor. The first NMOS transistor includes a first gate terminal, a first source terminal, and a first drain terminal, where the first drain terminal is connected to ground. A second NMOS transistor includes a second gate terminal arranged to receive a first input voltage, a second source terminal, and a second drain terminal connected to the first source terminal of the first NMOS transistor at a first node. A third NMOS transistor includes a third gate terminal arranged to receive a second input voltage, a third source terminal, and a third drain terminal connected to the first node.

A first PMOS transistor includes a fourth gate terminal, a fourth source terminal connected to a supply voltage, and a fourth drain terminal connected to the second source terminal of the second NMOS transistor at a second node. A second PMOS transistor includes a fifth gate terminal, a fifth source terminal connected to the supply voltage, and a fifth drain terminal connected to the third source terminal of the third NMOS transistor at a third node. The circuit further includes one or more capacitors connected between a fourth node at the second gate terminal of the second NMOS transistor and the third node. One or more capacitors are also connected between a fifth node at the third gate terminal of the third NMOS transistor and the second node. In one example, the circuit is a preamplifier stage of a dual tail voltage comparator.

In one example embodiment of the invention, a method for a circuit of a voltage comparator includes receiving a first input voltage at a first gate terminal of a first transistor. A second input voltage is received at a second gate terminal of a second transistor. A first common mode voltage at the first gate terminal of the first transistor is adjusted by utilizing one or more capacitors connected between the first gate terminal of the first transistor and a second source terminal of the second transistor. A second common mode voltage at the second gate terminal of the second transistor is adjusted by utilizing one or more capacitors connected to the second gate terminal of the second transistor and a first source terminal of first transistor.

The method further includes amplifying with positive feedback gain the first input voltage by utilizing the one or more capacitors connected between the first gate terminal of the first transistor and the second source terminal of the second transistor. The method further includes amplifying with positive feedback gain the second input voltage by utilizing the one or more capacitors connected to the second gate terminal of the second transistor and the first source terminal of the first transistor. In one example, the circuit is a preamplifier stage of a dual tail voltage comparator.

Figure 3:
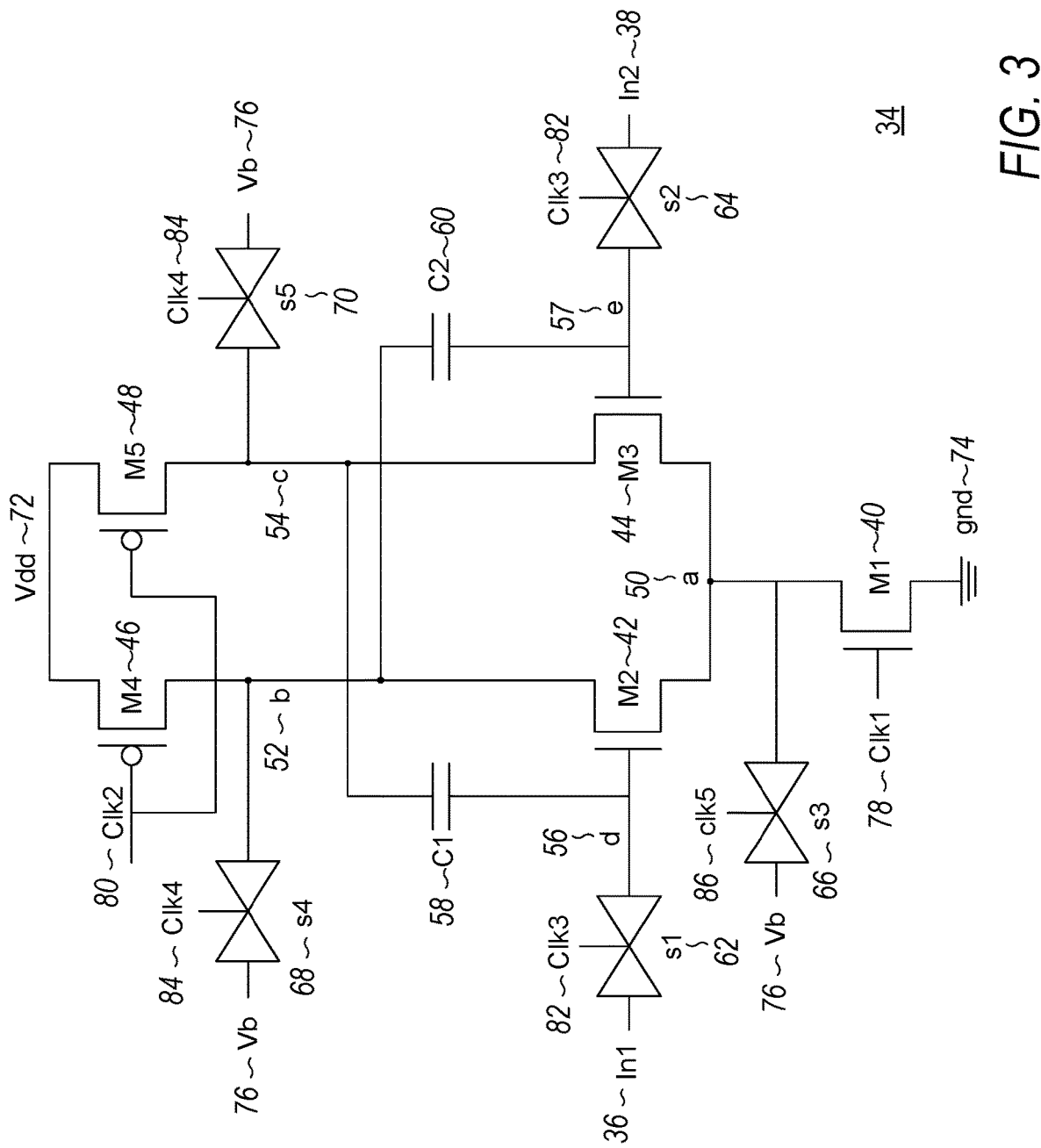
FIG. 3 is a schematic diagram illustrating a preamplifier stage for a dual tail comparator, in accordance with an embodiment of the invention.

FIG. 3 is a schematic diagram illustrating a preamplifier stage 34 for a dual tail comparator, in accordance with an embodiment of the invention. The preamplifier stage 34 includes an NMOS transistor M1 (40), an NMOS transistor M2 (42), an NMOS transistor M3 (44), a PMOS transistor M4 (46), and a PMOS transistor M5 (48).

The NMOS transistor M1 (40) includes a gate terminal, a source terminal, and a drain terminal, where the drain terminal is connected to a ground 74. The NMOS transistor M2 (42) includes a gate terminal arranged to selectively receive an input voltage In1 (36), a source terminal, and a drain terminal connected to the source terminal of the NMOS transistor M1 (40) at a node a (50). The NMOS transistor M3 (44) includes a gate terminal arranged to selectively receive an input voltage In2 (38), a source terminal, and a drain terminal connected to the node a (50). The input voltage In1 (36) and the input voltage In2 (38) are received for comparison. The NMOS transistor M2 (42) and the NMOS transistor M3 (44) may be referred to as an input pair of transistors.

The PMOS transistor M4 (46) includes a gate terminal, a source terminal connected to a supply voltage Vdd 72, and a drain terminal connected to the source terminal of the NMOS transistor M2 (42) at a node b (52). The PMOS transistor M5 (48) includes a gate terminal, a source terminal connected to the supply voltage Vdd 72, and a drain terminal connected to the source terminal of the NMOS transistor M3 (44) at a node c (54).

A capacitor C1 (58) is connected between a node d (56) at the gate terminal of the NMOS transistor M2 (42) and the node c (54). A capacitor C2 (60) is connected between a node e (57) at the gate terminal of the NMOS transistor M3 (44) and the node b (52). The capacitor C1 (58) and the capacitor C2 (60) may be referred to as a regenerative capacitive pair. In further embodiments, the capacitor C1 (58) and the capacitor C2 (60) may be replaced with capacitor circuits having one or more capacitors, transistors, or switches, such as those shown in FIG. 5A and FIG. 5B.

The preamplifier stage 34 further includes the switches s1 (62), s2 (64), s3 (66), s4 (68), and s5 (70). In one example, the switches are transmission gate ("T gate") switches including an NMOS transistor and a PMOS transistor. The switch s1 (62) is connected to the node d (56) to selectively sample the input voltage In1 (36) to the node d (56). The switch s2 (64) is connected to the node e (57) to selectively sample the input voltage In2 (38) to the node e (57). The switch s1 (62) and the switch s2 (64) may be referred to as sample switches. The node d (56) and the node e (57) may be referred to as sample nodes.

The switch s3 (66) is connected to the node a (50) to selectively apply a bias voltage Vb 76 to the node a (50). The node a (50) may be referred to as a source node and the bias voltage Vb 76 may be referred to as a pre-charge bias voltage. The switch s4 (68) is connected to the node b (52) to selectively apply the bias voltage Vb 76 to the node b (52). The switch s5 (70) is connected to the node c (54) to selectively apply the bias voltage Vb 76 to the node c (54). The node b (52) and the node c (54) may be referred to as drain nodes. The switch s3 (66), the switch s4 (68), and the switch s5 (70) may be referred to as pre-charge switches. The pre-charge switches are used to selectively pre-charge the drain nodes and source node to the pre-charge bias voltage Vb 76, where the pre-charge bias voltage Vb 76 depends on the common mode at the sample nodes.

The switches s1 (62), s2 (64), s3 (66), s4 (68) and s5 (70), and the NMOS transistor M1 (40), the PMOS transistor M4 (46) and the PMOS transistor M5 (48) receive control signals (e.g., clock signals) configured to (1) adjust a common mode voltage at the node d (56) utilizing the capacitor C1 (58), and adjust a common mode voltage at the node e (57) utilizing the capacitor C2 (60), and (2) amplify with positive feedback gain the input voltage In1 (36) and the input voltage In2 (38), where the capacitor C1 (58) and the capacitor C2 (60) provide positive feedback gain.

Referring still to FIG. 3, the switch s1 (62) and the switch s2 (64) are arranged to receive a clock signal Clk3 (82). The switch s3 (66) is arranged to receive a clock signal Clk5 (86). The switch s4 (68) and the switch s5 (70) are arranged to receive a clock signal Clk4 (84). The NMOS transistor M1 (40) is arranged to receive a clock signal Clk1 (78) at the gate terminal. The PMOS transistor M4 (46) is arranged to receive a clock signal Clk2 (80) at the gate terminal. The PMOS transistor M5 (48) is arranged to receive the clock signal Clk2 (80) at the gate terminal.

Figure 4:
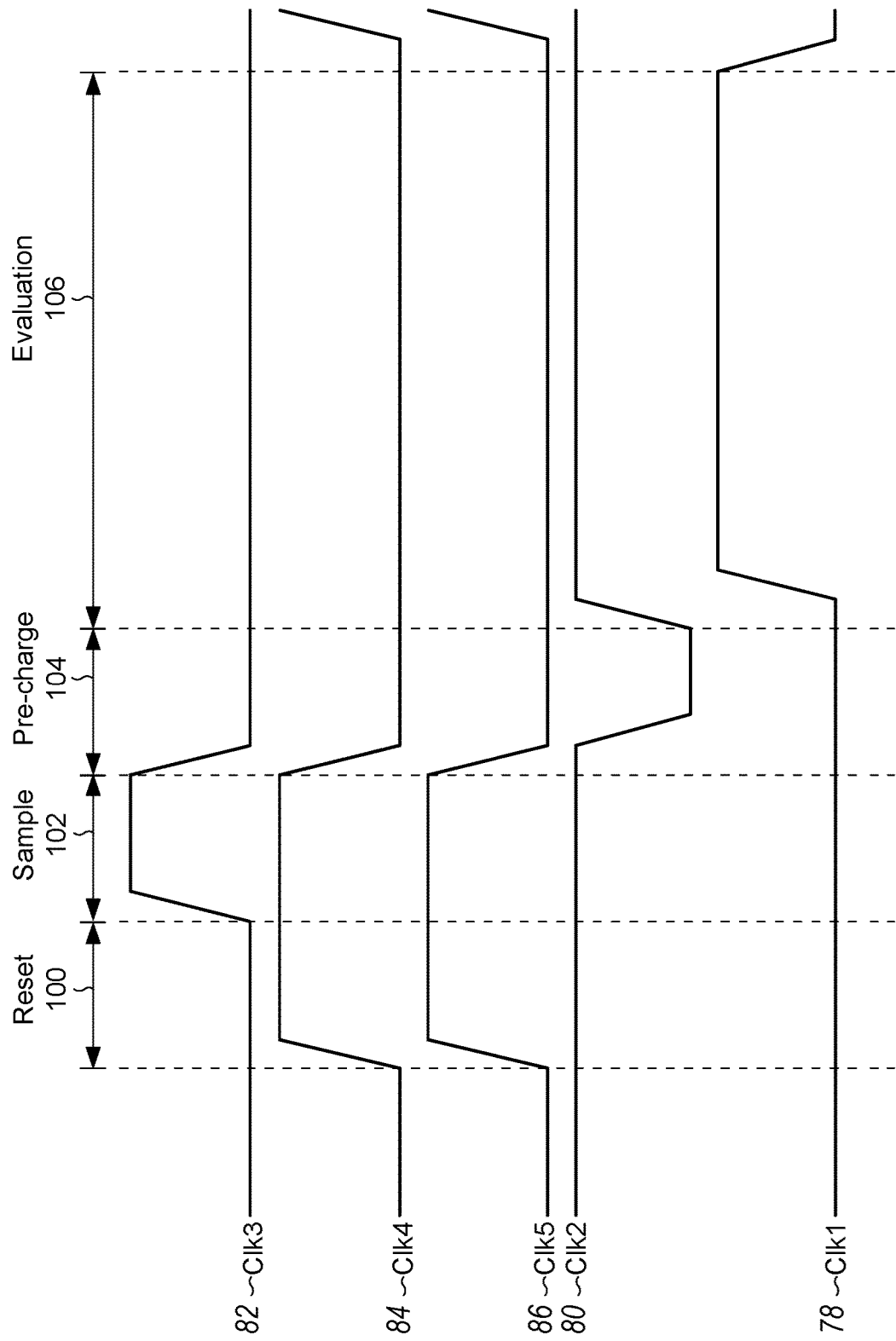
FIG. 4 is a schematic timing diagram representing clock waveforms in the preamplifier stage of FIG. 3, in accordance with an embodiment of the invention.

FIG. 4 is a schematic timing diagram representing clock waveforms for the clock signals Clk1 (78), Clk2 (80), Clk3 (82), Clk4 (84), and Clk5 (86) in the preamplifier stage 34 of FIG. 3 during a succession of operating phases, in accordance with an embodiment of the invention. The operating phases include a reset phase 100, a sample phase 102, a pre-charge phase 104, and an evaluation phase 106.

Prior to the reset phase 100, the clock signals Clk3 (82), Clk4 (84), and Clk5 (86) are low, resulting in the switches s1 (62), s2 (64), s4 (68), s5 (70), and s3 (66) being in an OFF state. The clock signal Clk1 (78) is also low, resulting in the NMOS transistor M1 (40) being deactivated (i.e., non-conducting). The clock signal Clk2 (80) is high, resulting in the PMOS transistor M4 (46) and the PMOS transistor M5 (48) being deactivated.

During the reset phase 100, the clock signal Clk4 (84) and the clock signal Clk5 (86) are pulsed high, resulting in the switches s4 (68), s5 (70), and s3 (66) being in an ON state, causing the node a (50), the node b (52), and the node c (54) to pre-charge to the bias voltage Vb 76. During the sample phase 102, the clock signal Clk3 (82) is pulsed high, resulting in the switch s1 (62) and the switch s2 (64) being in an ON state, causing the input voltage In1 (36) to be sampled (i.e., applied) at the node d (56) and the input voltage In2 (38) to be sampled at the node e (57).

During the pre-charge phase 104, the clock signal Clk3 (82), the clock signal Clk4 (84), and the clock signal Clk5 (86) are pulsed low, resulting in the switches s1 (62), s2 (64), s4 (68), s5 (70), and s3 (66) being in an OFF state. The clock signal Clk2 (80) is pulsed low, resulting in the PMOS transistor M4 (46) and the PMOS transistor M5 (48) being activated (i.e., conducting), and causing the node b (52) and the node c (54) to be pulled up from the bias voltage Vb 76 to the supply voltage Vdd 72. The PMOS transistor M4 (46) and the PMOS transistor M5 (48) may be referred to as pull-up transistors.

During the evaluation phase 106, the clock signal Clk2 (80) is pulsed high, resulting in the PMOS transistor M4 (46) and the PMOS transistor M5 (48) being deactivated. The clock signal Clk1 (78) is pulsed high, resulting in the NMOS transistor M1 (40) being activated, and causing the node a (50) to pull down from the bias voltage Vb 76 to ground 74. The NMOS transistor M1 (40) may be referred to as a tail switch. The voltages at the node b (52) and the node c (54) ramp down towards ground at different rates (i.e., "race") whereby the winner is decided by the larger sensed voltage In1 (36) at the node d (56) or In2 (38) at the node e (57) amplified with positive feedback. In particular, whichever of the input voltage In1 (36) and the input voltage In2 (38) is higher will cause the NMOS transistor M2 (42) or the NMOS transistor M3 (44) to turn on more, respectively, drawing a higher fraction of current and resulting in the node b (52) or the node c (54), respectively, to ramp down faster. A latch stage coupled to the preamplifier stage 34 at the node b (52) and the node c (54) captures which of the nodes has ramped down faster (i.e., the "winner.") As the voltages at the node b (52) and the node c (54) ramp down towards ground, the race prematurely ends when the voltages at the node b (52) and the node c (54) reach approximately below the thresholds of the NMOS transistor M2 (42) and the NMOS transistor M3 (44), since the voltages at the node d (56) and the node e (57) ramp down with the node b (52) and the node c (54) due to the capacitor C1 (58) and the capacitor C2 (60), turning off the NMOS transistor M2 (42) and the NMOS transistor M3 (44).

Advantageously, the input voltage In1 (36) is amplified with positive feedback gain using the capacitor C1 (58). The input voltage In2 (38) is amplified with positive feedback gain using the capacitor C2 (60). The node e (57) to the node b (52), and the node d (56) to the node c (54), are non-inverting gain paths. As the voltages at the top plates of the capacitor C1 (58) and the capacitor C2 (60) change, the voltages at the bottom plates of the capacitor C1 (58) and the capacitor C2 (60) change, respectively. During the race, as the voltages at the node b (52) and the node c (54) ramp down, there is an increasing difference at the node d (56) and the node e (57) resulting from the increasing difference at the node b (52) and the node c (54), producing a regeneration of gain.

Advantageously, during the pre-charge phase 104, the capacitor C1 (58) and the capacitor C2 (60) operate to adjust (either upward or downward) the common mode voltage at the node d (56) and the node e (57). For example, the common mode voltage at the node d (56) and the node e (57) may be adjusted downward to extend the race time of the node b (52) and the node c (54) to ensure it is long enough for latch stage distinguish the larger of the input voltage In1 (36) and the input voltage In2 (38).

Advantageously, the preamplifier stage 34 is operable over a wide input common mode range. For example, the preamplifier stage 34 may be configured to operate in a low common mode voltage configuration or a high common mode voltage configuration.

In one example, in the high common mode voltage configuration, an average of the input voltage In1 (36) and the input voltage In2 (38) is greater than the threshold voltage of the NMOS transistor M2 (42) and the NMOS transistor M3 (44). In the high common mode voltage configuration, the bias voltage Vb 76 is set to a high voltage, such as the supply voltage Vdd 72.

Figure 6:
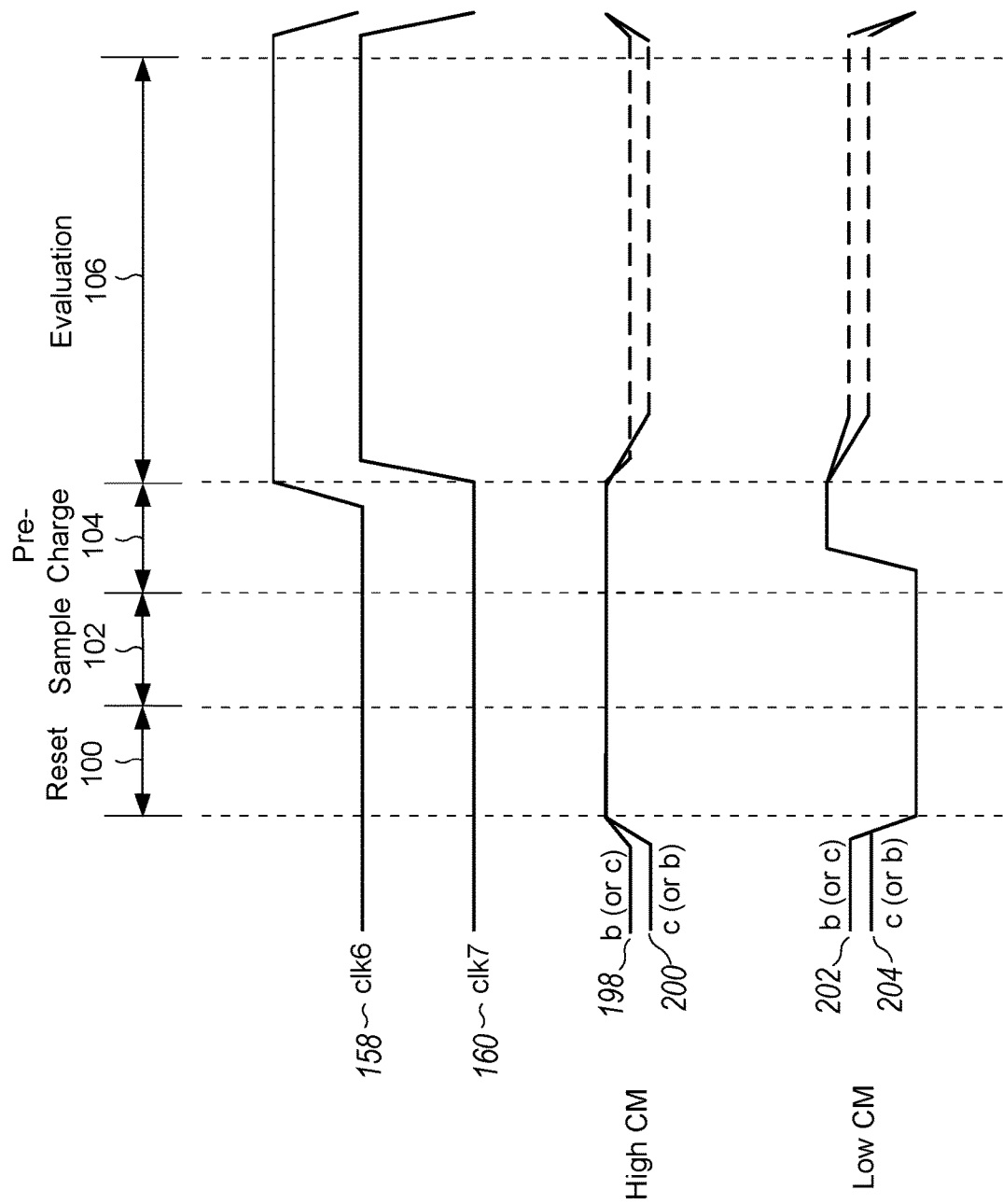
FIG. 6 illustrates a schematic timing diagram representing signal waveforms in the circuits shown in FIGS. 5A and 5B, and voltage waveforms in the preamplifier stage in a high common mode operation mode and a low common mode operation mode, in accordance with an embodiment of the invention.

Referring to FIG. 6, an example voltage waveform 198 and voltage waveform 200 at the node b (52) and the node c (54) (or vice versa) are illustrated in a high common mode voltage configuration operation. During the reset phase 100, the nodes a (50), b (52), and c (54) are pre-charged to the supply voltage Vdd 72. During the pre-charge phase 104, the node b (52) and the node c (54) are pulled up to the supply voltage Vdd 72. During the evaluation phase 106, the voltage at the node b (52) and the node c (54) ramp down at different rates depending upon which of the input voltage In1 (36) and the input voltage In2 (38) was greater.

In one example, in the low common mode voltage configuration, an average of the input voltage In1 (36) and the input voltage In2 (38) is less than a threshold voltage of the NMOS transistor M2 (42) and the NMOS transistor M3 (44). In the low common mode voltage configuration, the bias voltage Vb 76 is set to ground.

Referring to FIG. 6, an example voltage waveform 202 and voltage waveform 204 at the node b (52) and the node c (54) (or vice versa) are illustrated in a low common mode voltage configuration operation. During the reset phase 100, the nodes a (50), b (52), and c (54) are pre-charged to ground. During the pre-charge phase 104, the node b (52) and the node c (54) are pulled up from ground to the supply voltage Vdd 72. During the pre-charge phase 104, as the capacitor C1 (58) couples to the node d (56), it operates to pull-up the common mode voltage at the node d (56) to a voltage greater than the threshold voltage of the NMOS transistor M2 (42). Similarly, as the capacitor C2 (60) couples to the node e (57), it operates to pull up the common mode voltage at the node e (57) to a voltage greater than the threshold value of the NMOS transistor M3 (44). During the evaluation phase 106, the voltage at the node b (52) and the node c (54) ramp down at different rates depending upon which of the input voltage In1 (36) and the input voltage In2 (38) was greater.

Figure 5A:
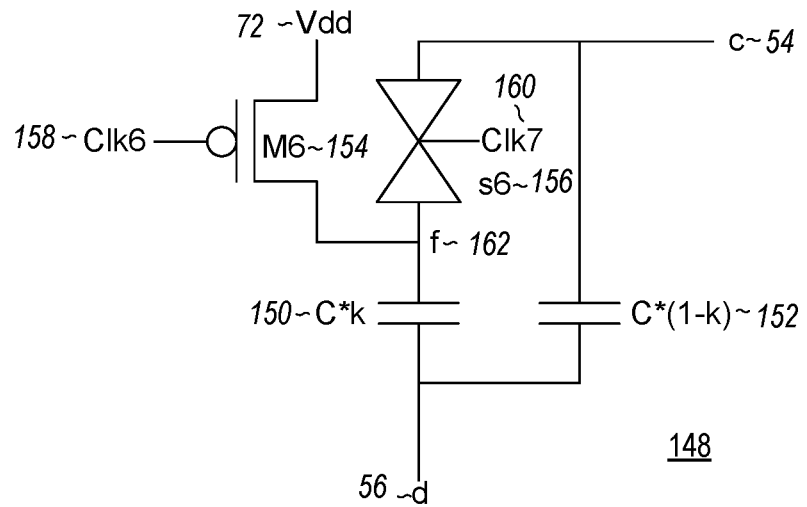
FIG. 5A and FIG. 5B illustrate a modification of the preamplifier stage of FIG. 3.
Figure 5B:
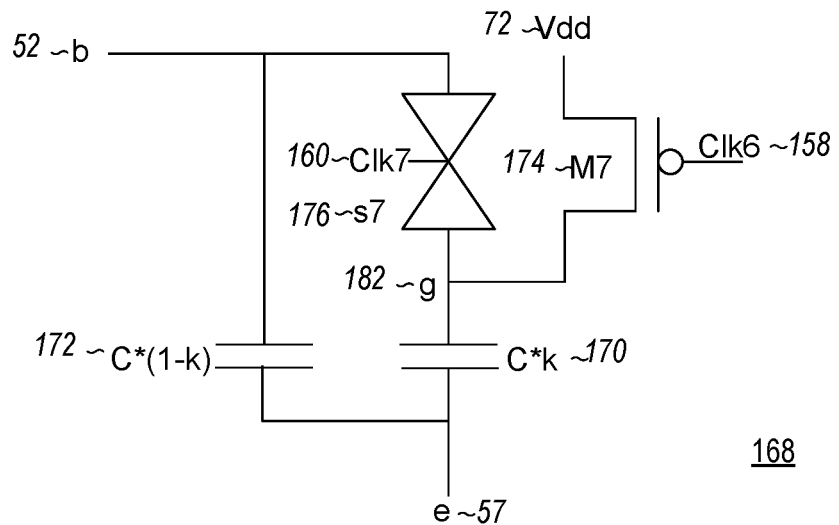

FIG. 5A and FIG. 5B illustrate a modification of the preamplifier stage 34 of FIG. 3. In particular, the capacitor C1 (58) between the node d (56) and the node c (54) has been replaced with a capacitor circuit 148 shown in FIG. 5A, and the capacitor C2 (60) between the node e (57) and the node b (52) has been replaced with a capacitor circuit 168 shown in FIG. 5B. The capacitor circuit 148 and the capacitor circuit 168 are a refinement used to adjust the amount of shift to the input common mode in low common mode operation. The adjustment is done by programming the amount of capacitance and hence common-mode voltage feedback from drain to gate during the pre-charge phase 104 when the clock signal Clk2 (80) is pulsed low. When the clock signal Clk1 (78) goes high, the full capacitance between drain and gate remain connected so the positive feedback gain is unchanged. For example, a 1-bit programmable capacitance may be implemented. In low common mode operation the clock signal Clk6 (158) and the clock signal Clk7 (160) are controlled to mix a fraction of the input sample with a complimentary fraction of the supply voltage Vdd 72 to change the common mode kick to the NMOS transistor M2 (42) and the NMOS transistor M3 (44) input pair.

Referring to FIG. 5A, the capacitor circuit 148 includes a capacitor C*(1−k) (152) always connected between the node d (56) and the node c (54), where k is a fraction for programming the amount of capacitance during the pre-charge phase 104. A switch s6 (156) is connected between the node c (54) and a node f (162) and controlled by the clock signal Clk7 (160). A capacitor C*k (150) is connected between the node d (56) and the node f (162). The capacitor circuit 148 further includes a PMOS transistor M6 (154) having a gate terminal arranged to receive a clock signal Clk6 (158), a source terminal connected to the supply voltage Vdd 72, and a drain terminal connected to the node f (162). Advantageously, the capacitor C*k (150) is arranged to controllably couple and decouple between the node d (56) and the node c (54). In further examples, more than one capacitor may controllably couple and decouple between the node d (56) and the node c (54).

Referring to FIG. 5B, the capacitor circuit 168 includes a capacitor C*(1−k) (172) always connected between the node b (52) and the node e (57). A switch s7 (176) is connected between the node b (52) and a node g (182) and controlled by the clock signal Clk7 (160). A capacitor C*k (170) is connected between the node e (57) and the node g (182). The capacitor circuit 168 further includes a PMOS transistor M7 (174) having a gate terminal arranged to receive the clock signal Clk6 (158), a source terminal connected to the supply voltage Vdd 72, and a drain terminal connected to the node g (182). Advantageously, the capacitor C*k (170) is arranged to controllably couple and decouple between the node e (57) and the node b (52). In further examples, more than one capacitor may controllably couple and decouple between the node b (52) and the node e (57).

FIG. 6 illustrates a schematic timing diagram representing signal waveforms in the circuits shown in FIGS. 5A and 5B, in accordance with an embodiment of the invention. The clock signal Clk6 (158) is initially low, resulting in the PMOS transistor M6 (154) and the PMOS transistor M7 (174) being activated. The clock signal Clk7 (160) is also initially low, resulting in the switch s6 (156) and the switch s7 (176) being in an OFF state. In this state, the capacitor C*k (150) is decoupled from between the node d (56) and the node c (54), and the capacitor C*k (170) is decoupled from between the node e (57) and the node b (52). During the pre-charge phase 104, the capacitor C*(1−k) (152) operates to adjust the common mode voltage at the node d (56). The capacitor C*(1−k) (172) operates to adjust the common mode voltage at the node e (57).

During the evaluation phase 106, the clock signal Clk6 (158) is high, resulting in the PMOS transistor M6 (154) and the PMOS transistor M7 (174) being deactivated. The clock signal Clk7 (160) is pulsed high, resulting in the switch s6 (156) and the switch s7 (176) being activated, causing the capacitor C*k (150) to couple between the node d (56) and the node c (54), and the capacitor C*k (170) to couple between the node e (57) and the node b (52). During the evaluation phase 106 both the switchable capacitor C*k (150) and the capacitor C*(1−k) (152) provide a positive feedback gain, and both the switchable capacitor C*k (170) and the capacitor C*(1−k) (172) provide a positive feedback gain. In one example, the sum of the capacitor C*k (150) and the capacitor C*(1−k) (152) is equal to the capacitor C1 (58) so that the total capacitance is available to provide regeneration during the evaluation phase 106. Similarly, the sum of the capacitor C*k (170) and the capacitor C*(1−k) (172) is equal to the capacitor C2 (60).

Figure 7:
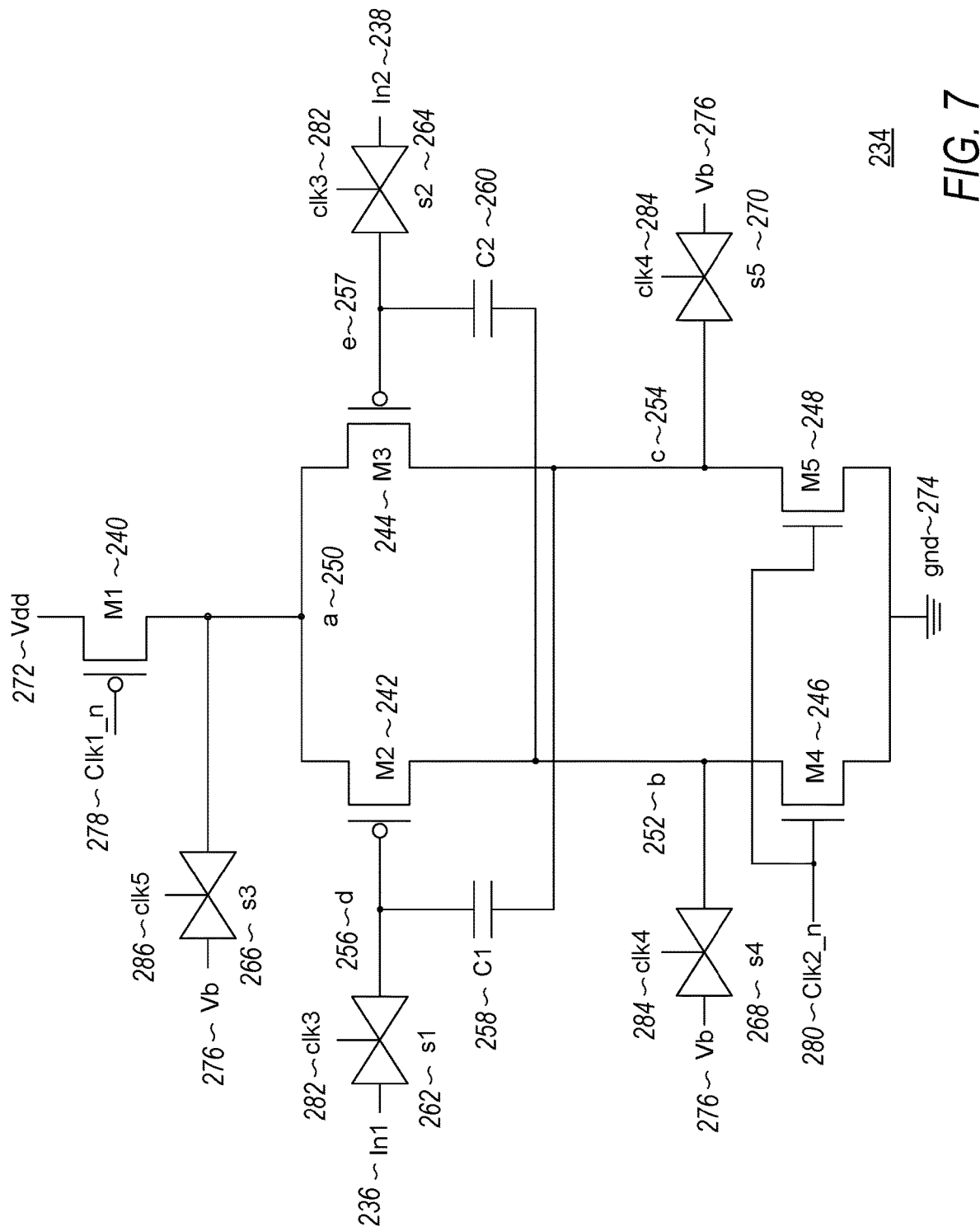
FIG. 7 is a schematic diagram illustrating a preamplifier stage for a dual tail comparator, in accordance with a further embodiment of the invention.

FIG. 7 is a schematic diagram illustrating a preamplifier stage 234 for a dual tail comparator, in accordance with a further embodiment of the invention. The preamplifier stage 234 is a variation of the preamplifier stage 34 shown in FIG. 3 where the polarities of the transistors have been switched. In particular, NMOS transistors have been replaced with PMOS transistors, PMOS transistors have been replaced with NMOS transistors, and the supply voltage and ground swapped. The preamplifier stage 234 operates in the same or similar manner as the preamplifier stage 34 described herein.

The preamplifier stage 234 includes a PMOS transistor M1 (240), a PMOS transistor M2 (242), a PMOS transistor M3 (244), an NMOS transistor M4 (246), and an NMOS transistor M5 (248). The PMOS transistor M1 (240) includes a gate terminal, a source terminal, and a drain terminal, where the source terminal is connected to a supply voltage Vdd 272. The PMOS transistor M2 (242) includes a gate terminal arranged to selectively receive an input voltage In1 (236), a drain terminal, and a source terminal connected to the drain terminal of the PMOS transistor M1 (240) at a node a (250). The PMOS transistor M3 (244) includes a gate terminal arranged to selectively receive an input voltage In2 (238), a drain terminal, and a source terminal connected to the node a (250).

The NMOS transistor M4 (246) includes a gate terminal, a drain terminal connected to a ground 274, and a source terminal connected to the drain terminal of the PMOS transistor M2 (242) at a node b (252). The NMOS transistor M5 (248) includes a gate terminal, a drain terminal connected to the ground 274, and a source terminal connected to the drain terminal of the PMOS transistor M3 (244) at a node c (254).

A capacitor C1 (258) is connected between a node d (256) at the gate terminal of the PMOS transistor M2 (242) and the node c (254). A capacitor C2 (260) is connected between a node e (257) at the gate terminal of the PMOS transistor M3 (244) and the node b (252). In further embodiments, the capacitor C1 (258) and the capacitor C2 (260) may be replaced with capacitor circuits having one or more capacitors, transistors, and switches. For example, a modification may be implemented similar to that as made to the preamplifier stage 34 shown in FIG. 5A and FIG. 5B.

The preamplifier stage 234 further includes the switches s1 (262), s2 (264), s3 (266), s4 (268), and s5 (270). In one example, the switches are T gate switches including an NMOS transistor and a PMOS transistor. The switch s1 (262) is connected to the node d (256) to selectively sample the input voltage In1 (236) to the node d (256). The switch s2 (264) is connected to the node e (257) to selectively sample the input voltage In2 (238) to the node e (257). The switch s3 (266) is connected to the node a (250) to selectively apply a bias voltage Vb 276 to the node a (250). The switch s4 (268) is connected to the node b (252) to selectively apply the bias voltage Vb 276 to the node b (252). The switch s5 (270) is connected to the node c (254) to selectively apply the bias voltage Vb 276 to the node c (254).

The switches s1 (262), s2 (264), s3 (266), s4 (268) and s5 (270), and the PMOS transistor M1 (240), the NMOS transistor M4 (246) and the NMOS transistor M5 (248) receive control signals (e.g., clock signals) configured to (1) adjust a common mode voltage at the node d (256) utilizing the capacitor C1 (258), and adjust the common mode voltage at the node e (257) utilizing the capacitor C2 (260), and (2) amplify with positive feedback gain the input voltage In1 (236) and the input voltage In2 (238), where the capacitor C1 (258) and the capacitor C2 (260) provide positive feedback gain.

Referring still to FIG. 7, the switch s1 (262) and the switch s2 (264) are arranged to receive a clock signal Clk3 (282). The switch s3 (266) is arranged to receive a clock signal Clk5 (286). The switch s4 (268) and the switch s5 (270) are arranged to receive a clock signal Clk4 (284). The PMOS transistor M1 (240) is arranged to receive a clock signal Clk1_n (278) at the gate terminal. The NMOS transistor M4 (246) is arranged to receive a clock signal Clk2_n (280) at the gate terminal. The NMOS transistor M5 (248) is arranged to receive the clock signal Clk2_n (280) at the gate terminal. The clock signals Clk3 (282), Clk4 (284), and Clk5 (286) are the same as Clk3 (82), Clk4 (84), and Clk5 (86) in FIG. 4, respectively. The clock signal Clk1_n (278) and the clock signal Clk2_n (280) have a polarity inversion relative to Clk1 (78) and the clock signal Clk2 (80), respectively.

For purpose of clarity, details relating to technical material that is known in the technical fields related to the invention have not been described in detail so as not to unnecessarily obscure the present invention. It is to be understood that various examples of the invention, although different, are not necessarily mutually exclusive. Thus, a particular feature, characteristic, or structure described in one example embodiment may be included within other embodiments unless otherwise noted.

While the exemplary embodiments of the present invention are described and illustrated herein, it will be appreciated that they are merely illustrative and that modifications can be made to these embodiments without departing from the spirit and scope of the invention. Thus, the scope of the invention is intended to be defined only in terms of the following claims as may be amended, with each claim being expressly incorporated into this Description of Specific Embodiments as an embodiment of the invention.

What is claimed is:

1. A circuit for a voltage comparator comprising:
a first transistor;
a second transistor for receiving a first input voltage at a second transistor gate terminal and a third transistor for receiving a second input voltage at a third transistor gate terminal, the second transistor and the third transistor connected to the first transistor at a first node;
a fourth transistor and a fifth transistor, the fourth transistor connected to the second transistor at a second node and the fifth transistor connected to the third transistor at a third node;
one or more capacitors connected between the third node and a fourth node, the fourth node comprising the second transistor gate terminal;
one or more capacitors connected between the second node and a fifth node, the fifth node comprising the third transistor gate terminal;
a first switch arranged to selectively sample the first input voltage to the fourth node;
a second switch arranged to selectively sample the second input voltage to the fifth node;
a third switch arranged to selectively apply a bias voltage to the first node;
a fourth switch arranged to selectively apply the bias voltage to the second node; and
a fifth switch arranged to selectively apply the bias voltage to the third node.

2. The circuit of claim 1, wherein the first transistor comprises a first NMOS transistor, the second transistor comprises a second NMOS transistor, the third transistor comprises a third NMOS transistor, the fourth transistor comprises a first PMOS transistor, and the fifth transistor comprises a second PMOS transistor, wherein the first NMOS transistor comprises a first NMOS transistor drain terminal connected to ground, the first PMOS transistor comprises a first PMOS transistor source terminal connected to a supply voltage, and the second PMOS transistor comprises a second PMOS transistor source terminal connected to the supply voltage.

3. The circuit of claim 1, wherein the first transistor comprises a first PMOS transistor, the second transistor comprises a second PMOS transistor, the third transistor comprises a third PMOS transistor, the fourth transistor comprises a first NMOS transistor, and the fifth transistor comprises a second NMOS transistor, wherein the first PMOS transistor comprises a first PMOS transistor source terminal connected to a supply voltage, the first NMOS transistor comprises a first NMOS transistor drain terminal connected to ground, and the second NMOS transistor comprises a second NMOS transistor drain terminal connected to ground.

4. The circuit of claim 1, wherein the circuit is configured to utilize the one or more capacitors connected between the third node and the fourth node to provide a first positive feedback gain and adjust a common mode voltage at the fourth node, and the circuit is further configured to utilize the one or more capacitors connected between the second node and the fifth node to provide a second positive feedback gain and adjust the common mode voltage at the fifth node.

5. The circuit of claim 1, wherein the circuit is configured to:
pre-charge to the bias voltage the first node, the second node, and the third node during a first operating phase;
sample the first input voltage at the fourth node and sample the second input voltage at the fifth node during a second operating phase;
pull-up the second node and the third node from the bias voltage to a supply voltage during a third operating phase; and
pull-down the first node from the bias voltage to a ground during a fourth operating phase.

6. The circuit of claim 5, wherein during the third operating phase the one or more capacitors connected between the third node and the fourth node operate to adjust a common mode voltage at the fourth node and the one or more capacitors connected between the second node and the fifth node operate to adjust the common mode voltage at the fifth node.

7. The circuit of claim 5, wherein circuit is configured to operate in one selected from a low common mode voltage configuration and a high common mode voltage configuration.

8. The circuit of claim 7, wherein in the low common mode voltage configuration a first average of the first input voltage and the second input voltage is less than a threshold voltage of the second transistor and the third transistor, and in high common mode voltage configuration a second average of the first input voltage and the second input voltage is greater than the threshold voltage of the second transistor and the third transistor.

9. The circuit of claim 5, wherein the bias voltage is set to a ground voltage, and during the third operating phase the one or more capacitors connected between the third node and the fourth node operate to pull-up a common mode voltage at the fourth node to a voltage greater than a threshold voltage of the second transistor, and the one or more capacitors connected between the second node and the fifth node operate to pull up the common mode voltage at the fifth node to the voltage greater than a threshold value of the third transistor.

10. The circuit of claim 5, wherein:
the one or more capacitors connected between the third node and the fourth node comprise a switchable first capacitor arranged to controllably couple and decouple from between the fourth node and the third node and a second capacitor, wherein during the third operating phase the switchable first capacitor is decoupled and the second capacitor operates to adjust a common mode voltage at the fourth node, and during the fourth operating phase both the switchable first capacitor and the second capacitor provide a first positive feedback gain, and
the one or more capacitors connected between the second node and the fifth node comprise a switchable third capacitor arranged to controllably couple and decouple from between the fifth node and the second node and a fourth capacitor, wherein during the third operating phase the switchable third capacitor is decoupled and the fourth capacitor operates to adjust the common mode voltage at the fifth node, and during the fourth operating phase both the switchable third capacitor and the fourth capacitor provide a second positive feedback gain.

11. The circuit of claim 1, wherein the first switch comprises a first transmission gate, the second switch comprises a second transmission gate, the third switch comprises a third transmission gate, the fourth switch comprises a fourth transmission gate, and the fifth switch comprises a fifth transmission gate.

12. The circuit of claim 1, wherein the first transistor comprises a first transistor gate terminal arranged to receive a first control signal, the fourth transistor comprises a fourth transistor gate terminal arranged to receive a second control signal, the fifth transistor comprises a fifth transistor gate terminal arranged to receive the second control signal, the first switch is arranged to receive a third control signal, the second switch is arranged to receive the third control signal, the third switch is arranged to receive a fifth control signal, the fourth switch is arranged to receive a fourth control signal, and the fifth switch is arranged to receive the fourth control signal, wherein the first control signal, the second control signal, the third control signal, the fourth control signal, and the fifth control signal comprise clock signals configured to:
pre-charge to the bias voltage the first node, the second node, and the third node during a first operating phase;
sample the first input voltage at the fourth node and sample the second input voltage at the fifth node during a second operating phase;
pull-up the second node and the third node from the bias voltage to a supply voltage during a third operating phase; and
pull-down the first node from the bias voltage to a ground during a fourth operating phase.

13. The circuit of claim 12, wherein during the third operating phase the one or more capacitors connected between the third node and the fourth node operate to adjust a common mode voltage at the fourth node and the one or more capacitors connected between the second node and the fifth node operate to adjust the common mode voltage at the fifth node.

14. A circuit for a voltage comparator comprising:
a first NMOS transistor comprising a first gate terminal, a first source terminal, and a first drain terminal, wherein the first drain terminal is connected to ground;
a second NMOS transistor comprising a second gate terminal arranged to receive a first input voltage, a second source terminal, and a second drain terminal connected to the first source terminal of the first NMOS transistor at a first node; and
a third NMOS transistor comprising a third gate terminal arranged to receive a second input voltage, a third source terminal, and a third drain terminal connected to the first node;
a first PMOS transistor comprising a fourth gate terminal, a fourth source terminal connected to a supply voltage, and a fourth drain terminal connected to the second source terminal of the second NMOS transistor at a second node;
a second PMOS transistor comprising a fifth gate terminal, a fifth source terminal connected to the supply voltage, and a fifth drain terminal connected to the third source terminal of the third NMOS transistor at a third node; and
one or more capacitors connected between a fourth node at the second gate terminal of the second NMOS transistor and the third node;
one or more capacitors connected between a fifth node at the third gate terminal of the third NMOS transistor and the second node;
a first switch connected to the fourth node;
a second switch connected to the fifth node;
a third switch connected to the first node;
a fourth switch connected to the second node; and
a fifth switch connected to the third node.

15. The circuit of claim 14, wherein the first NMOS transistor is arranged to receive a first control signal at the first gate terminal, the first PMOS transistor is arranged to receive a second control signal at the fourth gate terminal, the second PMOS transistor is arranged to receive the second control signal at the fifth gate terminal, the first switch is arranged to receive a third control signal, the second switch is arranged to receive the third control signal, the third switch is arranged to receive a fifth control signal, the fourth switch is arranged to receive a fourth control signal, and the fifth switch is arranged to receive the fourth control signal.

16. The circuit of claim 15, wherein the first control signal, the second control signal, the third control signal, the fourth control signal, and the fifth control signal are clock signals configured to:
   pre-charge to a bias voltage the first node, the second node, and the third node during a first operating phase;
   sample the first input voltage at the fourth node and sample the second input voltage at the fifth node during a second operating phase;
   pull-up the second node and the third node from the bias voltage to the supply voltage during a third operating phase; and
   pull-down the first node from the bias voltage to a ground during a fourth operating phase.

17. The circuit of claim 15, wherein the first control signal, the second control signal, the third control signal, the fourth control signal, and the fifth control signal are clock signals configured to:
   adjust a common mode voltage at the fourth node and the fifth node; and
   amplify with positive feedback gain the first input voltage and the second input voltage.

18. The circuit of claim 14, wherein the first switch comprises a first transmission gate, the second switch comprises a second transmission gate, the third switch comprises a third transmission gate, the fourth switch comprises a fourth transmission gate, and the fifth switch comprises a fifth transmission gate.

19. A circuit for a voltage comparator comprising:
   a first NMOS transistor comprising a first gate terminal, a first source terminal, and a first drain terminal, wherein the first drain terminal is connected to ground;
   a second NMOS transistor comprising a second gate terminal arranged to receive a first input voltage, a second source terminal, and a second drain terminal connected to the first source terminal of the first NMOS transistor at a first node; and
   a third NMOS transistor comprising a third gate terminal arranged to receive a second input voltage, a third source terminal, and a third drain terminal connected to the first node;
   a first PMOS transistor comprising a fourth gate terminal, a fourth source terminal connected to a supply voltage, and a fourth drain terminal connected to the second source terminal of the second NMOS transistor at a second node;
   a second PMOS transistor comprising a fifth gate terminal, a fifth source terminal connected to the supply voltage, and a fifth drain terminal connected to the third source terminal of the third NMOS transistor at a third node; and
   one or more capacitors connected between a fourth node at the second gate terminal of the second NMOS transistor and the third node; and
   one or more capacitors connected between a fifth node at the third gate terminal of the third NMOS transistor and the second node, wherein
   the one or more capacitors connected between the fourth node and the third node comprise a first capacitor and a second capacitor, wherein the first capacitor is arranged to controllably couple and decouple between the second gate terminal of the second NMOS transistor and the third node, and
   the one or more capacitors connected between the fifth node and the second node comprise a third capacitor and a fourth capacitor, wherein the third capacitor is arranged to controllably couple and decouple between the third gate terminal of the third NMOS transistor and the second node.

20. A method for a circuit of a voltage comparator comprising:
   receiving a first input voltage at a first gate terminal of a first transistor;
   receiving a second input voltage at a second gate terminal of a second transistor;
   adjusting a first common mode voltage at the first gate terminal of the first transistor comprising utilizing one or more capacitors connected between the first gate terminal of the first transistor and a second source terminal of the second transistor;
   adjusting a second common mode voltage at the second gate terminal of the second transistor comprising utilizing one or more capacitors connected to the second gate terminal of the second transistor and a first source terminal of the first transistor;
   amplifying with positive feedback gain the first input voltage comprising utilizing the one or more capacitors connected between the first gate terminal of the first transistor and the second source terminal of the second transistor; and
   amplifying with positive feedback gain the second input voltage comprising utilizing the one or more capacitors connected to the second gate terminal of the second transistor and the first source terminal of the first transistor, wherein:
   the one or more capacitors connected between the first gate terminal of the first transistor and the second source terminal of the second transistor comprises a first capacitor and a second capacitor, wherein adjusting the first common mode voltage comprises decoupling the first capacitor from between the first gate terminal of the first transistor and the second source terminal of the second transistor, and wherein amplifying with positive feedback gain the first input voltage comprises coupling the first capacitor between the first gate terminal of the first transistor and the second source terminal of the second transistor, and
   the one or more capacitors connected to the second gate terminal of the second transistor and the first source terminal of first transistor comprises a third capacitor and a fourth capacitor, wherein adjusting the second common mode voltage comprises decoupling the third capacitor from between the second gate terminal of the second transistor and the first source terminal of the first transistor, and wherein amplifying with positive feedback gain the second input voltage comprises coupling the third capacitor between the second gate terminal of the second transistor and the first source terminal of the first transistor.

21. The method of claim 20, wherein
   adjusting the first common mode voltage comprises pulling up the first common mode voltage at the first gate terminal to a first increased common mode voltage greater than a first threshold level of the first transistor, and
   adjusting the second common mode voltage comprises pulling up the second common mode voltage at the second gate terminal to a second increased common mode voltage greater than a second threshold level of the second transistor.

22. A circuit for a voltage comparator comprising:
   a first transistor;

a second transistor for receiving a first input voltage at a second transistor gate terminal and a third transistor for receiving a second input voltage at a third transistor gate terminal, the second transistor and the third transistor connected to the first transistor at a first node;

a fourth transistor and a fifth transistor, the fourth transistor connected to the second transistor at a second node and the fifth transistor connected to the third transistor at a third node;

one or more capacitors connected between the third node and a fourth node, the fourth node comprising the second transistor gate terminal;

one or more capacitors connected between the second node and a fifth node, the fifth node comprising the third transistor gate terminal, wherein the circuit is configured to:

pre-charge to a bias voltage the first node, the second node, and the third node during a first operating phase;

sample the first input voltage at the fourth node and sample the second input voltage at the fifth node during a second operating phase;

pull-up the second node and the third node from the bias voltage to a supply voltage during a third operating phase; and pull-down the first node from the bias voltage to a ground during a fourth operating phase.

23. The circuit of claim 22, wherein during the third operating phase the one or more capacitors connected between the third node and the fourth node operate to adjust a common mode voltage at the fourth node and the one or more capacitors connected between the second node and the fifth node operate to adjust the common mode voltage at the fifth node.

24. The circuit of claim 22, wherein circuit is configured to operate in one selected from a low common mode voltage configuration and a high common mode voltage configuration.

* * * * *